United States Patent [19]

Chen et al.

[11] 4,142,174
[45] Feb. 27, 1979

[54] HIGH SPEED DECODING OF REED-SOLOMON CODES

[75] Inventors: Chin L. Chen, Wappingers Falls; Mu Y. Hsiao, Poughkeepsie, both of N.Y.

[73] Assignee: International Business Machines Corporation, Armonk, N.Y.

[21] Appl. No.: 824,763

[22] Filed: Aug. 15, 1977

[51] Int. Cl.$^2$ .............................................. G06F 11/12
[52] U.S. Cl. ................. 340/146.1 AL; 340/146.1 AV
[58] Field of Search ................ 340/146.1, 146.1 AL, 340/146.1 AV

[56] References Cited

U.S. PATENT DOCUMENTS

| | | | |
|---|---|---|---|
| 3,648,236 | 3/1972 | Burton | 340/146.1 AV |
| 3,668,632 | 6/1972 | Oldham | 340/146.1 AL |
| 3,714,629 | 1/1973 | Hong et al. | 340/146.1 AL |
| 3,913,068 | 10/1975 | Patel | 340/146.1 AL |
| 3,983,536 | 9/1976 | Telfer | 340/146.1 AL |

*Primary Examiner*—Charles E. Atkinson
*Attorney, Agent, or Firm*—J. E. Murray

[57] ABSTRACT

This specification covers a simplified and high speed decoding scheme for Reed-Solomon codes capable of correcting up to three symbol errors in code words made up of k data and n-k check symbols where each symbol consists of m binary bits of information. In such a code the error location polynomial $\sigma(x) = x^e + \sigma_1 x^{e-1} \ldots \sigma_e$ where e equals the number of symbol errors and the coefficient of $\sigma(x)$ are related to the error syndromes $S_i$ by the equation $$S_{i+e} + \sigma_1 S_{i+e-1} + \ldots + \sigma_{e-1} S_{i+1} + \sigma_e S_i = 0.$$

The decoder first tests if $S_0 = 0$. If $S_0 \neq 0$, the assumption is made that a single symbol error has occurred. The decoder quickly verifies this by determining if $S_2 + \sigma S_1 = 0$ and $S_3 + \sigma S_2 = 0$ when $\sigma = S_1/S_0$. If the error is not a single symbol error the decoder goes on to determine if a double symbol error has occurred and then goes on to determine if there are triple symbol errors if it turns out that a double symbol error has not occurred.

9 Claims, 5 Drawing Figures

HIGH SPEED DECODING OF REED-SOLOMON CODES

BACKGROUND OF THE INVENTION

The present invention relates to Reed-Solomon codes and more particularly to decoding of such codes.

Reed-Solomon codes are the most powerful random error correcting codes now known. Since these codes form a class of Bose-Chaudhuri-Hocquenghem (BCH) codes, general BCH decoding techniques can be applied to them. A typical BCH decoding procedure is to first calculate the error syndromes, then find the error location polynomial, thereafter search for the roots of the error correction polynomial and finally calculate the errors and make the actual correction or corrections. This specification deals with the finding of the error location polynomial. General solutions to this problem are known such as those described in Chapter 9 of Error-Correcting Codes, Second Edition, by Peterson and Weldon, published in 1972 by The MIT Press, Cambridge, Massachusetts. It is also generally known that it is possible to obtain particular solutions for specific applications and it has been suggested in Bossen et al, U.S. Pat. No. 3,893,071 that where a code is capable of correcting one or more errors to first check to see if a single error has occurred and if it has, correct for it. This is done on the basis that most errors are single errors and checking for multiple errors would be time consuming. However with Reed-Solomon codes the number of calculations needed to be made to find the error location polynomial in this manner is significant.

THE INVENTION

Therefore in accordance with the present invention a decoding scheme is generated for Reed-Solomon code which is based on the idea of checking for single errors first and correcting for them prior to checking for higher value errors. In Reed-Solomon codewords made up of k data and n-k check symbols where each symbol is made up of m binary bits, the error location polynomial $\sigma(x) = x^e + \sigma_1 x^{e-1} \ldots + \sigma_e$ where e equals the number of errors and the coefficients of $\sigma(x)$ are related to the error syndromes $S_i$ for the codeword by the equation $$S_{i+e} + \sigma S_{i+e-1} + \ldots + \sigma_{e-1} S_{i+1} + \sigma_e S_i = 0.$$

A decoder incorporating the present invention first tests to see if $S_0 = 0$. If $S_0 \neq 0$, the assumption is made that a single symbol error has occurred. The decoder quickly verifies this by determining if $S_2 + \sigma S_1 = 0$ and $S_3 + \sigma S_2 = 0$ when $\sigma = S_1/S_0$. If the error is not a single symbol error the decoder goes on to determine if a double symbol error has occurred and then goes on to determine if there are triple symbol errors if it turns out that a double symbol error has not occurred.

Therefore it is an object of the present invention to provide a simplified decoding scheme for BCH codes.

Another object is to increase the speed of decoding for Reed-Solomon codes.

Further objects are to simplify decoding for Reed-Solomon codes used to correct three symbol errors.

THE DRAWINGS

These and other objects, features and advantages of the invention will be apparent from the following detailed description of a preferred embodiment of the invention as illustrated in the accompanying drawings of which:

DETAILED EMBODIMENT

Figure 1:
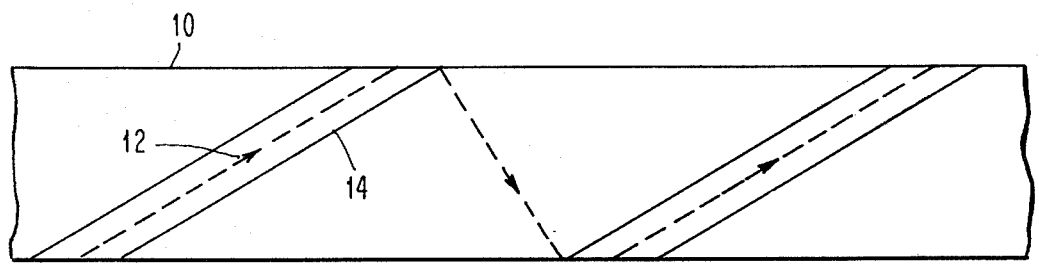
FIG. 1 is a schematic of a tape containing data.
Figure 2:
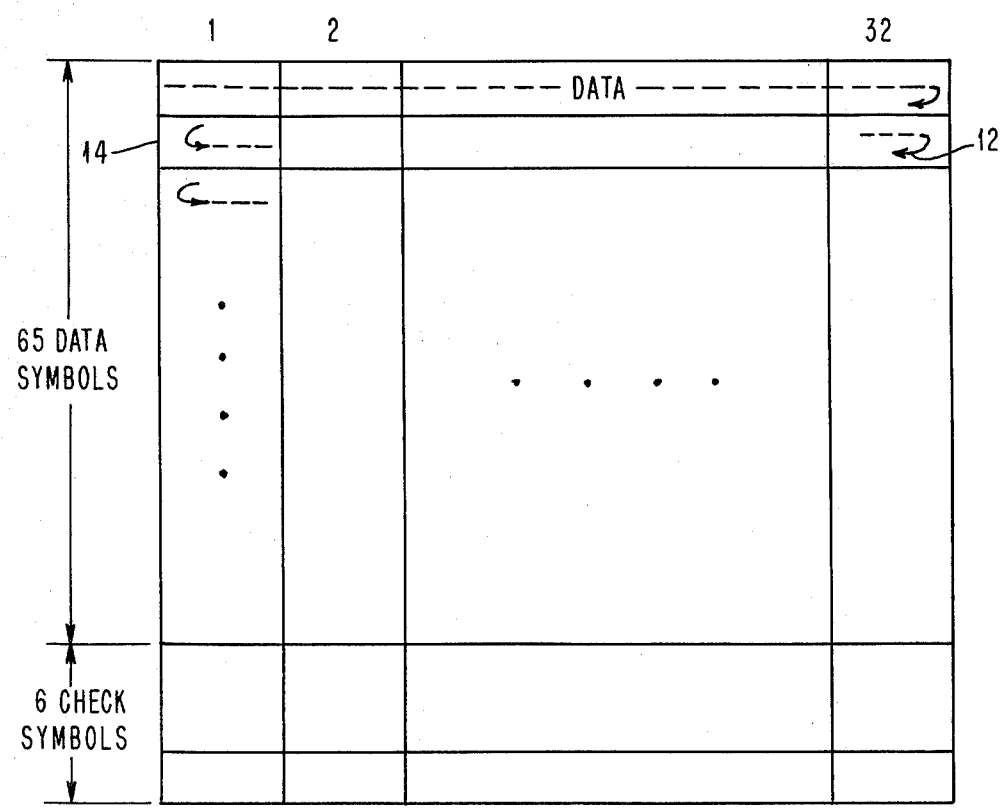
FIG. 2 is the format in which data is stored on the tape of FIG. 1.

As shown in FIG. 1 data is arranged serially and recorded diagonally on tape 10 in the direction shown by the arrows on the dotted lines. Each data stripe across the tape contains a segment of data 14. As shown in FIG. 2 each segment of data 14 is made up of 32 codewords each made up of 65 data bytes or symbols and 6 check bytes or symbols. Each of the bytes or symbols contains eight binary data bits.

The codewords are arranged on the tape in the manner described in Patel, U.S. Pat. No. 3,913,068. That is the first byte of word 1 is recorded. Then the first byte of word 2 and so on until the first byte of all 32 words is recorded. After that the second bytes of all words are recorded. Then the third bytes of all words are recorded. This continues until all 72 bytes in each of the 32 words is recorded. By recording data in this manner, burst errors up to 96 bytes or 768 bits long can be corrected using the check bytes for correcting three bytes in each word.

The check bytes or symbols are generated using a triple-error-correcting Reed-Solomon codes where the 6 check symbols are binary m-tuples. In standard coding terms set forth in Chapter 7 of the previously mentioned Peterson and Weldon reference, the code symbols are elements of $GF(2^m)$, the finite field of $2^m$ elements where m = 8, the number of bits in the symbols.

The generator polynomial g(x) of the code is $$g(x) = (x-1)(x-\alpha)(x-\alpha^2)(x-\alpha^3)(x-\alpha^4)(x-\alpha^5) \quad (1)$$

where $\alpha$ is a primitive element of $GF(2^m)$. The code length is assumed to be less than or equal to $2^m - 1$.

Let C(x) and R(x) be the transmitted codeword and the received codeword, respectively. The difference between R(x) and C(x) is the error polynomial E(x), i.e., $$R(x) = C(x) + E(x) \quad (2)$$

where the coefficients of the polynomials are in $GF(2^m)$. The error polynomial contains only the terms corresponding to the locations and the values of the errors. Thus, if $Y_j$ is the value of the error at position $x^j$, then $$E(x) = \sum_j Y_j x^j \quad (3)$$

where the summation is over all positions of the errors.

The codeword C(x) is always divisible by g(x), i.e., $C(\alpha^i) = 0$ for $0 \leq i \leq 5$. From (2), we have $$R(\alpha^i) = C(\alpha^i) + E(\alpha^i)$$
$$= E(\alpha^i) \quad \text{for } 0 \leq i \leq 5.$$

Let us define $$i S_d = E(\alpha^i)$$
$$= R(\alpha^i) \qquad (4)$$

$S_i$ is called an error syndrome and is obtained by evaluating $R(x)$ at $x = \alpha^i$. From this definition and (3), we have $$S_i = E(\alpha^i) = \sum_j Y_j (\alpha^i)^j.$$

Let $X_j = \alpha^j$. $X_j$ represents the error location at $\alpha^j$. Then $$S_i = \sum_j Y_j X_j^i \qquad (5)$$

The error-location polynomial $\sigma(x)$ is defined by
$$\sigma(X) = \pi_i(X - X_i)$$
$$= X^e + \sigma_1 X^{e-1} + \ldots + \sigma_e \qquad (6)$$

where $e$ is the number of errors. The coefficients of $\sigma(X)$ are related to the error syndromes $S_i$ by the following equations:

$$S_{i+e} + \sigma_1 S_{i+e-1} + \ldots + \sigma_{e-1} S_{i+1} + \sigma_e S_i = 0 \qquad (7)$$

Our problem here is to solve for $\sigma_i$ based on the set of equations in (7).

Let us write out the equations of (7) explicitly for the cases $e = 1$, $e = 2$, and $e = 3$.

Case $e = 1$
$$\begin{aligned} S_1 + \sigma_1 S_0 &= 0 \\ S_2 + \sigma_1 S_1 &= 0 \\ S_3 + \sigma_1 S_2 &= 0 \\ S_4 + \sigma_1 S_3 &= 0 \\ S_5 + \sigma_1 S_4 &= 0 \end{aligned} \qquad (8)$$

Case $e = 2$
$$\begin{aligned} S_2 + \sigma_1 S_1 + \sigma_2 S_0 &= 0 \\ S_3 + \sigma_1 S_2 + \sigma_2 S_1 &= 0 \\ S_4 + \sigma_1 S_3 + \sigma_2 S_2 &= 0 \\ S_5 + \sigma_1 S_4 + \sigma_2 S_3 &= 0 \end{aligned} \qquad (9)$$

Case $e = 3$
$$\begin{aligned} S_3 + \sigma_1 S_2 + \sigma_2 S_1 + \sigma_3 S_0 &= 0 \\ S_4 + \sigma_1 S_3 + \sigma_2 S_2 + \sigma_3 S_1 &= 0 \\ S_5 + \sigma_1 S_4 + \sigma_2 S_3 + \sigma_3 S_2 &= 0 \end{aligned} \qquad (10)$$

Suppose that the decoder starts with the assumption $e = 1$. The decoder would have to find a solution $\sigma_1$ to the five equations in (8). If there is no solution to (8), then the decoder assumes $e = 2$ and tries to solve for $\sigma_1$ and $\sigma_2$ in (9).

If there is no solution again, then the decoder assumes $e = 3$ and tries to solve for the equations in (10). If there is no solution, the decoder assumes $e > 3$. If this is the case, there are more than 3 errors.

The procedure described above involves the solving of all the equations (8), (9) and (10). In accordance with the present invention, a new decoder is provided to reduce the number of calculations in the decoding procedure. The following properties of the error syndromes are keys to the new procedure.

Property 1 — If $S_i \neq 0$ for some $i$, $0 \leq i \leq 5$, then $e \geq 1$.

Proof: If $e = 0$, then $S_i = 0$ for $0 \leq i \leq 5$. Thus, $S_i \neq 0$ implies $e \neq 0$.

Property 2 — If $S_i = 0$ and $S_j \neq 0$ for some $i$ and $j$ such that $i \neq j$, and $0 \leq i, j \leq 5$, then $e \geq 2$.

Proof: From Property 1, $e \neq 0$. If $e = 1$, then $S_i = Y_j X_j^i \neq 0$ for $0 \leq i \leq 5$. Since some $S_i = 0$, $e \neq 1$.

Property 3 — If $S_0 \neq 0$, and $S_2 S_0 + S_1^2 = 0$, then $e = 1$, or $e \geq 3$.

Proof: We have to show $e \neq 2$. From page 284 of the above-mentioned Peterson and Weldon reference, it is sufficient to show that the determinant $$\Delta = \begin{vmatrix} S_1 S_0 \\ S_2 S_1 \end{vmatrix} = 0$$

Since $\Delta = S_1^2 + S_0 S_2 = 0$ by assumptions, Property 3 is true.

Property 4 — If $S_0 \neq 0$, $S_2 S_0 + S_1^2 = 0$, and $S_3 S_0 + S_1 S_2 = 0$, then $e = 1$, or $e > 3$.

Proof: From Property 3, we only have to show $e \neq 3$. It is sufficient to show that $$\Delta_3 = \begin{vmatrix} S_2 S_1 S_0 \\ S_3 S_2 S_1 \\ S_4 S_3 S_2 \end{vmatrix} = 0$$

Now, $\Delta_3 = S_2(S_2^2 + S_1 S_3) + S_3(S_1 S_2 + S_0 S_3) + S_4(S_1^2 + S_0 S_2) = S_2(S_2^2 + S_1 S_3)$ by assumptions. Also, from the assumptions $S_1 S_2 + S_0 S_3 = 0$ and $S_1^2 + S_2 S_0 = 0$, we have either $S_1 = S_2 = S_3 = 0$, or $S_2^2 + S_1 S_3 = 0$. Thus, $\Delta_3 = 0$.

Property 5 — Let $\Delta = S_1^2 + S_0 S_2 \neq 0$, $\sigma_1 = (S_1 S_2 + S_0 S_3)/\Delta$, $\sigma_2 = (S_1 S_3 + S_2^2)/\Delta$. If $D = S_4 + \sigma_1 S_3 + \sigma_2 S_2 = 0$, then $e = 2$, or $e > 3$.

Proof: Since $\Delta \neq 0$, $e \neq 0$ and $e \neq 1$ [Peterson and Weldon, p. 284]. It is sufficient to show $e \neq 3$. Since $$\begin{aligned} \Delta_3 &= \begin{vmatrix} S_2 S_1 S_0 \\ S_3 S_2 S_1 \\ S_4 S_3 S_2 \end{vmatrix} = S_2(S_2^2 + S_1 S_3) \\ &\quad + S_3(S_1 S_2 + S_0 S_3) \\ &\quad + S_4(S_1^2 + S_0 S_2) \\ &= S_2 \sigma_2 \Delta + S_3 \sigma_1 \Delta + S_4 \Delta \\ &= \Delta(S_4 + \sigma_1 S_3 + \sigma_2 S_2) \\ &= \Delta \cdot D = 0, \\ e &\neq 3. \end{aligned}$$

Property 6 — If $S_0 = S_1 = 0$, $S_2 \neq 0$, then $e \geq 3$.

Proof: Property 6 follows from Property 3 and Property 2.

Property 7 — If $S_0 = S_1 = S_2 = 0$, and $S_i = 0$ for some $i$, $3 \leq i \leq 5$, then $e \geq 3$.

Proof: From Property 6, $e \leq 3$. Since $S_0 = S_1 = S_2 = 0$, the determinant $\Delta_3$ in the proof of Property 5 is zero. Thus, $e \neq 3$.

Figure 3:
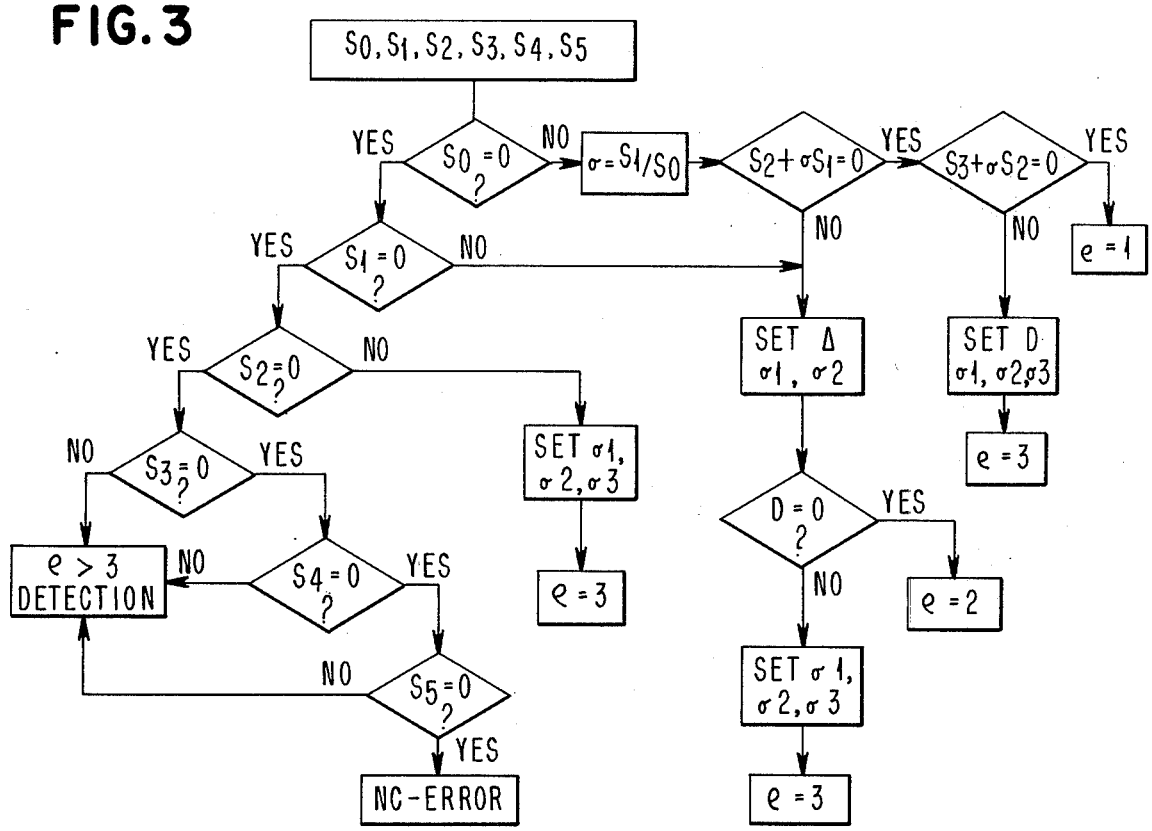
FIG. 3 is a flow diagram illustrating the decoding procedure.

Based on the properties presented at the end of the last section, a procedure shown in FIG. 3 can be used for the calculation of the coefficients of the error-location polynomial.

(0) If $S_0 \neq 0$, $e \geq 1$ is assumed. Next step is (1). If $S_0 = 0$, and $S_1 \neq 0$, $e \geq 2$ is assumed. Next step is (2). If $S_0 = S_1 = 0$, and $S_2 \neq 0$, $e = 3$ is assumed. Next step is (5). If $S_0 = S_1 = S_2 = 0$, and $S_i \neq 0$ for some $i$, $3 \leq i \leq 5$, $e \geq 3$ is detected. If $S_i = 0$ for $0 \leq i \leq 5$, no error is assumed.

(1) $S_0 \neq 0$. Set $\sigma = S_1/S_0$. If $S_2 + \sigma S_1 \neq 0$, $e \geq 2$ is assumed. Next step is (2). If $S_2 + \sigma S_1 = 0$, and $S_3 + \sigma S_2 \neq 0$, $e \geq 3$ is assumed. Next step is (4). If $S_2 + \sigma S_1 = S_3 + \sigma S_2 = 0$, $e = 1$ is assumed. Let $X_i = \sigma$, $Y_i = S_0$. (2)

$\Delta = S_1^2 + S_0 S_2 \neq 0$. Set $\sigma_1 = (S_1 S_2 + S_0 S_3)/\Delta$, $\sigma_2 = (S_1 S_3 + S_2^2)/\Delta$, $D = S_4 + \sigma_1 S_3 + \sigma_2 S_2$.
If $D = 0$, $e = 2$ is assumed.
If $D \neq 0$, $e = 3$ is assumed. Next step is (3).

(3) Set
$$\sigma_1^1 = (S_3 \sigma_2 + S_4 \sigma_1 + S_5)/D$$

$\sigma_2^1 = 1/\Delta (S_1S_3 + S_0S_4) + \sigma_1^1 \sigma_1$
$\sigma_3^1 = 1/\Delta (S_1S_4 + S_2S_3) + \sigma_1^1 \sigma_2$
(4) $S_0 S_2 + S_1^2 = 0$. Set $D = S_0 S_3 + S_1 S_2$, and
$\sigma_1 = 1/D (S_1S_3 + S_0S_4)$
$\sigma_2 = 1/D [S_2 (S_3 + \sigma_1 S_2) + (S_5 + \sigma_1 S_4) S_0]$
$\sigma_3 = 1/S_0 (S_3 + \sigma_1 S_2 + \sigma_2 S_1)$
(5) $S_0 = S_1 = 0, S_2 \neq 0$. Set
$\sigma_1 = S_3/S_2$
$\sigma_2 = 1/S_2 (S_4 + \sigma_1 S_3)$
$\sigma_3 = 1/S_2 (S_5 + \sigma_1 S_4 + \sigma_2 S_3)$ The procedure is designed for the correction of 3 or fewer number of errors. The validity of the procedure follows from Property 1 to Property 7.

EXAMPLE

Let $\alpha$ be a root of the polynomial $X^8 + X^6 + X^5 + X^4 + 1$ in $GF(2^8)$. The generator of the three-symbol (or three-byte) error correcting code is
$g(x) = (x+1)(x+\alpha)(x+\alpha^2)(x+\alpha^3)(x+\alpha^4)(x+\alpha^5)$
$= x^6 + \alpha^{94} x^5 + \alpha^{10} x^4 + \alpha^{136} x^3 + \alpha^5 x^2 + \alpha^{104} x + \alpha^{15}$.

Consider the following three cases of errors:
Case I. $e = 1, x = \alpha^{30}, y = \alpha^{19}$
$S_0 = \alpha^{19}$
$S_1 = \alpha^{49}$
$S_2 = \alpha^{79}$
$S_3 = \alpha^{109}$
$S_4 = \alpha^{139}$
$S_5 = \alpha^{169}$ Case II. $e = 2, x_1 = \alpha^{10}, y_1 = \alpha^{54} x_2 = \alpha^{48}, y_1 = \alpha$
$S_0 = \alpha^{162}$
$S_1 = \alpha^{31}$
$S_2 = \alpha^{156}$
$S_3 = \alpha^{214}$
$S_4 = \alpha^{180}$
$S_5 = \alpha^{195}$ Case III. $e = 3, x_1 = 1, y_1 = \alpha^{41} x_2 = \alpha^{21}, y_2 = \alpha x_3 = \alpha^{62}, y_3 = \alpha^{128}$
$S_0 = \alpha^{172}$
$S_1 = \alpha^{235}$
$S_2 = \alpha^{152}$
$S_3 = \alpha^{53}$
$S_4 = \alpha^{25}$
$S_5 = \alpha^{54}$ In each case let us go through the procedure for the calculation of the coefficients of the error-location polynomial.

Case I.
(1) Set $\sigma = S_1/S_0 = \alpha^{49}/\alpha^{19} = \alpha^{30}$
(2) test for $S_2 + \sigma S_1 = 0$ $S_2 + \sigma S_1 = \alpha^{79} + \alpha^{30+49} = 0$
(3) test for $S_3 + \sigma S_2 = 0$
$S_3 + \sigma S_2 = \alpha^{109} + \alpha^{30+79} = 0$
$x = \sigma = \alpha^{30}$
$y = S_0 = \alpha^{19}$ Case II.
(1) Set $\sigma = S_1/S_0 = \alpha^{--162} = \alpha^{124}$
set $\Delta_1 = S_2 + \sigma S_1 = \alpha^{156} + \alpha^{124+31} = \alpha^{131} \Delta_1 \neq 0$
(3) set $\Delta = S_0 \Delta_1 = \alpha^{38}$
$\sigma_1 = (S_1 1S_2 + S_0 S_3)/\Delta = (\alpha^{187} + \alpha^{121})/\alpha^{38} = \alpha^{119}$
$\sigma_2 = 0 (S_1S_3 + S_2^2)/\Delta = (\alpha^{245} + \sigma^{57})/\alpha^{38} = \alpha^{58}$
(4) test for $D = S_4 + \sigma_1 S_3 + \sigma_2 S_2 = 0$
$D = \alpha^{180} + \alpha^{119+214} + \alpha^{58+156} = 0$ thus $\sigma(x) = x^2 + \alpha^{119} x + \alpha^{58}$ Case III.
(1) Set $\sigma = S_1/S_0 = \alpha^{63}$
(2) test $\Delta_1 = S_2 + \sigma S_1$
$\Delta_1 = \alpha^{152} + \alpha^{63+235} = \alpha^{81} \neq 0$
(3) set $\Delta = S_0 \Delta_1 = \alpha^{253}$
$\sigma_1 = (S_1S_2 + S_0S_3)/\Delta = \alpha^{69}$
$\sigma_2 = (S_1S_3 + S_2^2)/\Delta = \alpha^{161}$
(4) test $D = S_4 + \sigma_1 S_3 + \sigma_2 S_2$
$D = \alpha^{25} + \alpha^{122} + \alpha^{58} = \alpha^{203} \neq 0$
(5) $\sigma_1^1 = (S_3\sigma_2 + S_4\sigma_1 + S_5)/D = \alpha^{79}$
$\sigma_2^1 = 1/\Delta (S_1S_3 + S_0S_4) + \sigma_1^1 \sigma_1 = \alpha^{187}$
$\sigma_3^1 = 1/\Delta (S_1S_4 + S_2S_3) + \sigma_1^1 \sigma_2 = \alpha^{83}$
thus $\sigma(x) = x^3 + \alpha^{79} x^2 + \alpha^{187} x + \alpha^{83}$.

Figure 4:
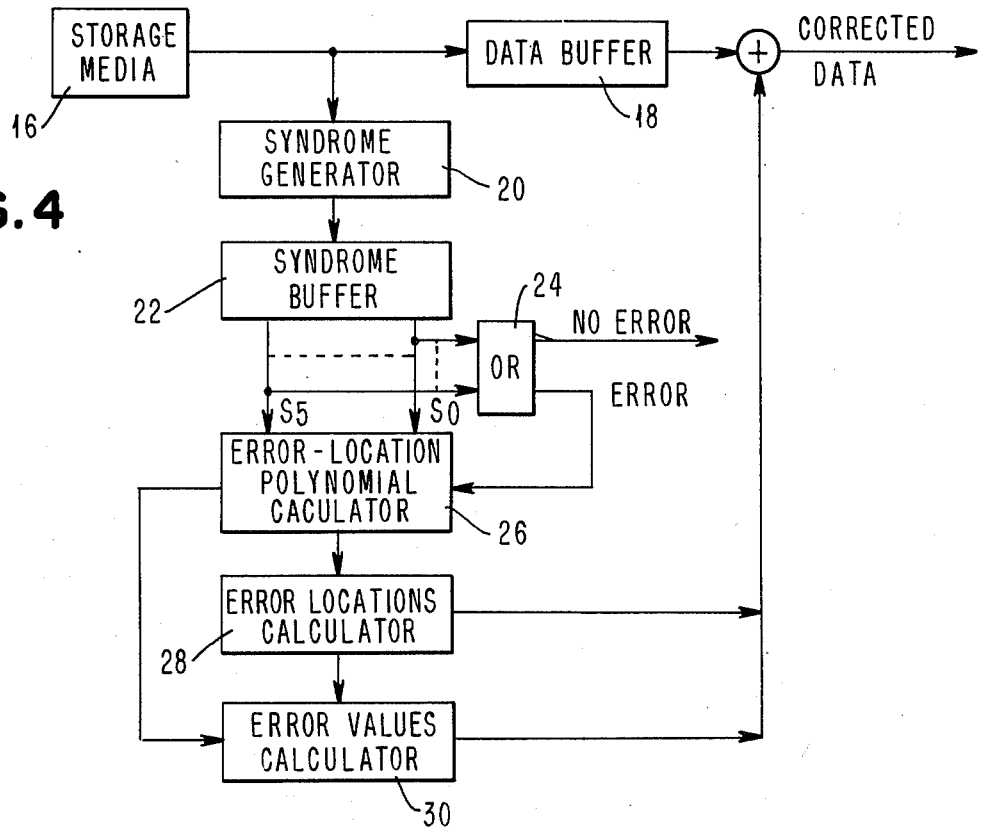
FIG. 4 is a decoder for Reed-Solomon codes capable of correcting three symbol errors.

An overall diagram for the decoding of Reed-Solomon codes for three-symbol error correction is shown in FIG. 4. The data read out from storage media 16 such as magnetic tape are stored in data buffer 18 while the data are being decoded. In the first step of decoding, the data are fed into syndrome generator 20 to generate syndromes $S_0, S_1, S_2, S_3, S_4, S_5$. The syndromes are stored in syndrome buffer 22. The OR gates 24 of the syndromes determine if errors exist. If the errors exist, the decoder starts the error correction procedure. The error-location polynomial calculator 26 calculates the error-location polynomial using the procedure shown in FIG. 3. The error-location calculator 28 finds the roots of the error-location polynomial using known prior art schemes such as the one described in the book entitled, Algebraic Coding Theory written by E. R. Berlekamp and published in 1968 by McGraw-Hill or described in Flagg U.S. application serial number 613,592, filed Sept. 15, 1975 and assigned to the same assignee as the present invention. Finally the error values calculator 30 determines the value of error at each error location. The error locations and the error values are used to modify the data from the output of the data buffer.

Figure 5:
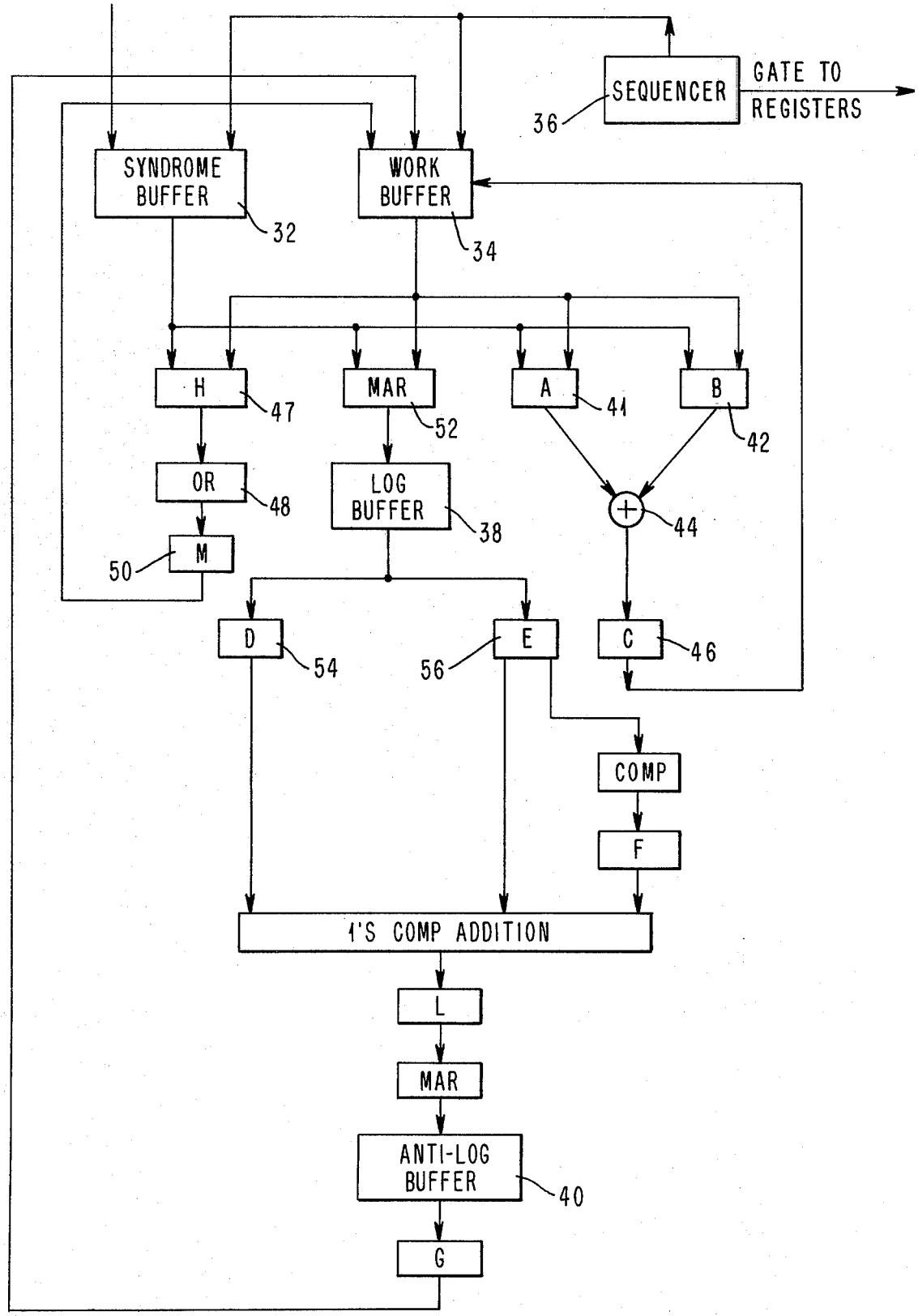
FIG. 5 is a hardware implementation for the error location polynomial calculator of the decoder in FIG. 4.

The implementation of error-location polynomial calculator 26 of the decoder is shown in FIG. 5. Syndrome buffer 32 is a read/write memory that stores the syndromes $S_0, S_1, S_2, S_3, S_4, S_5$. Each syndrome is an element of $GF(2^m)$ and is stored in m-bit binary form. For example, $\alpha^{17}$ in $GF(2^8)$ is stored as 11101001. Work buffer 34 is a read/write buffer which stores intermediate as well as final results of the algebraic operations in the calculation of the coefficients of the error-location polynomial. Partial results that will be used in succeeding operations are stored in this buffer. The sequencer 36 directs the sequence of algebraic operations. It provides addresses to the syndrome buffer and work buffer. It turns on the read/write lines to these buffers and gates the proper registers for algebraic operations. It examines an output of algebraic operation and branches to next appropriate operation. An example of a sequencer could be a microprocessor programmed to perform the sequence of events set forth in FIG. 3.

The log buffer 38 and anti-log buffer 40 are read only memory buffers that stores tables for the logarithm and antilogorithm of the field elements of $GF(2^m)$. An address of log buffer is the binary representation of a field element, say $\alpha^i$. The entry in the address is the logorithm of $\alpha^i$ with $\alpha$ as a base; i.e., i. On the other hand, the entry in the address i of anti-log buffer is the binary representation of $\alpha^i$. The log and anti-log tables for the field elements described in this specification are:

| | LOG TABLE | | | | | | | | ANTI-LOG TABLE | | | | | | | |
|---|---|---|---|---|---|---|---|---|---|---|---|---|---|---|---|---|
| ADDRESS | ENTRY | | | | | | | | ADDRESS | ENTRY | | | | | | |
| 1  | 0 | 0 | 0 | 0 | 0 | 1 | 1 | 1 | 1  | 0 | 1 | 0 | 0 | 0 | 0 | 0 | 0 |
| 2  | 0 | 0 | 0 | 0 | 0 | 1 | 1 | 0 | 2  | 0 | 0 | 1 | 0 | 0 | 0 | 0 | 0 |
| 3  | 1 | 1 | 1 | 0 | 1 | 1 | 0 | 1 | 3  | 0 | 0 | 0 | 1 | 0 | 0 | 0 | 0 |
| 4  | 0 | 0 | 0 | 0 | 0 | 1 | 0 | 1 | 4  | 0 | 0 | 0 | 0 | 1 | 0 | 0 | 0 |
| 5  | 1 | 1 | 0 | 1 | 0 | 1 | 0 | 0 | 5  | 0 | 0 | 0 | 0 | 0 | 1 | 0 | 0 |
| 6  | 1 | 1 | 1 | 0 | 1 | 1 | 0 | 0 | 6  | 0 | 0 | 0 | 0 | 0 | 0 | 1 | 0 |
| 7  | 0 | 1 | 0 | 0 | 0 | 0 | 0 | 0 | 7  | 0 | 0 | 0 | 0 | 0 | 0 | 0 | 1 |
| 8  | 0 | 0 | 0 | 0 | 0 | 1 | 0 | 0 | 8  | 1 | 0 | 0 | 0 | 1 | 1 | 1 | 0 |
| 9  | 0 | 0 | 1 | 0 | 0 | 1 | 1 | 1 | 9  | 0 | 1 | 0 | 0 | 0 | 1 | 1 | 1 |
| 10 | 1 | 1 | 0 | 1 | 0 | 0 | 1 | 1 | 10 | 1 | 0 | 1 | 0 | 1 | 1 | 0 | 1 |
| 11 | 0 | 0 | 0 | 1 | 1 | 0 | 0 | 0 | 11 | 1 | 1 | 0 | 1 | 1 | 0 | 0 | 0 |
| 12 | 1 | 1 | 1 | 0 | 1 | 0 | 1 | 1 | 12 | 0 | 1 | 1 | 0 | 1 | 1 | 0 | 0 |
| 13 | 1 | 0 | 0 | 1 | 1 | 1 | 1 | 0 | 13 | 0 | 0 | 1 | 1 | 0 | 1 | 1 | 0 |
| 14 | 0 | 0 | 1 | 1 | 1 | 1 | 1 | 1 | 14 | 0 | 0 | 0 | 1 | 1 | 0 | 1 | 1 |
| 15 | 1 | 0 | 1 | 1 | 1 | 0 | 1 | 1 | 15 | 1 | 0 | 0 | 0 | 0 | 0 | 1 | 1 |
| 16 | 0 | 0 | 0 | 0 | 0 | 0 | 1 | 0 | 16 | 1 | 1 | 0 | 0 | 1 | 1 | 1 | 1 |
| 17 | 1 | 0 | 1 | 0 | 0 | 0 | 1 | 0 | 17 | 1 | 1 | 1 | 0 | 1 | 0 | 0 | 1 |
| 18 | 0 | 0 | 1 | 0 | 0 | 1 | 1 | 0 | 18 | 1 | 1 | 1 | 1 | 1 | 0 | 1 | 0 |
| 19 | 1 | 1 | 1 | 1 | 1 | 0 | 0 | 0 | 19 | 0 | 1 | 1 | 1 | 1 | 1 | 0 | 1 |
| 20 | 1 | 1 | 0 | 1 | 0 | 0 | 1 | 0 | 20 | 1 | 0 | 1 | 0 | 0 | 0 | 0 | 0 |
| 21 | 0 | 1 | 1 | 1 | 1 | 0 | 0 | 1 | 21 | 0 | 1 | 0 | 1 | 1 | 0 | 0 | 0 |
| 22 | 0 | 0 | 0 | 1 | 0 | 1 | 1 | 1 | 22 | 0 | 0 | 1 | 0 | 1 | 1 | 0 | 0 |
| 23 | 1 | 0 | 0 | 0 | 0 | 1 | 0 | 1 | 23 | 0 |   | 0 | 1 | 0 | 1 | 1 | 0 |
| 24 | 1 | 1 | 1 | 0 | 1 | 0 | 1 | 0 | 24 | 0 | 0 | 0 | 0 | 1 | 0 | 1 | 1 |
| 25 | 0 | 1 | 0 | 0 | 0 | 1 | 0 | 1 | 25 | 1 | 0 | 0 | 0 | 1 | 0 | 1 | 1 |
| 26 | 1 | 0 | 0 | 1 | 1 | 1 | 0 | 1 | 26 | 1 | 1 | 0 | 0 | 1 | 0 | 1 | 1 |
| 27 | 0 | 0 | 0 | 1 | 1 | 1 | 1 | 0 | 27 | 1 | 1 | 1 | 0 | 1 | 0 | 1 | 1 |
| 28 | 0 | 0 | 1 | 1 | 1 | 1 | 1 | 0 | 28 | 1 | 1 | 1 | 1 | 1 | 0 | 1 | 1 |
| 29 | 1 | 1 | 1 | 1 | 1 | 1 | 1 | 0 | 29 | 1 | 1 | 1 | 1 | 0 | 0 | 1 | 1 |
| 30 | 1 | 0 | 1 | 1 | 1 | 0 | 1 | 0 | 30 | 1 | 1 | 1 | 1 | 0 | 1 | 1 | 1 |
| 31 | 1 | 0 | 0 | 1 | 0 | 1 | 0 | 1 | 31 | 1 | 1 | 1 | 1 | 0 | 1 | 0 | 1 |
| 32 | 0 | 0 | 0 | 0 | 0 | 0 | 1 | 0 | 32 | 1 | 1 | 1 | 1 | 0 | 1 | 0 | 0 |
| 33 | 0 | 1 | 1 | 1 | 1 | 1 | 0 | 0 | 33 | 0 | 1 | 1 | 1 | 1 | 0 | 1 | 0 |
| 34 | 1 | 0 | 1 | 0 | 0 | 0 | 0 | 1 | 34 | 0 | 0 | 1 | 1 | 1 | 1 | 0 | 1 |
| 35 | 1 | 1 | 0 | 1 | 0 | 1 | 1 | 1 | 35 | 1 | 0 | 0 | 1 | 0 | 0 | 0 | 0 |
| 36 | 0 | 0 | 1 | 0 | 0 | 1 | 0 | 1 | 36 | 0 | 1 | 0 | 0 | 1 | 0 | 0 | 0 |
| 37 | 1 | 1 | 1 | 0 | 0 | 0 | 1 | 0 | 37 | 0 | 0 | 1 | 0 | 0 | 1 | 0 | 0 |
| 38 | 1 | 1 | 1 | 1 | 0 | 1 | 1 | 1 | 38 | 0 | 0 | 0 | 1 | 0 | 0 | 1 | 0 |
| 39 | 1 | 1 | 1 | 0 | 0 | 1 | 0 | 1 | 39 | 0 | 0 | 0 | 0 | 1 | 0 | 0 | 1 |
| 40 | 1 | 1 | 0 | 1 | 0 | 0 | 0 | 1 | 40 | 1 | 0 | 0 | 0 | 1 | 0 | 1 | 0 |
| 41 | 0 | 1 | 1 | 0 | 0 | 1 | 1 | 1 | 41 | 0 | 1 | 0 | 0 | 0 | 1 | 0 | 1 |
| 42 | 0 | 1 | 1 | 1 | 1 | 0 | 0 | 0 | 42 | 1 | 0 | 1 | 0 | 1 | 1 | 0 | 0 |
| 43 | 0 | 0 | 1 | 0 | 1 | 1 | 0 | 0 | 43 | 0 | 1 | 0 | 1 | 0 | 1 | 1 | 0 |
| 44 | 0 | 0 | 0 | 1 | 0 | 1 | 1 | 0 | 44 | 0 | 0 | 1 | 0 | 1 | 0 | 1 | 1 |
| 45 | 1 | 1 | 1 | 1 | 0 | 1 | 0 | 0 | 45 | 1 | 0 | 0 | 1 | 1 | 0 | 1 | 1 |
| 46 | 1 | 0 | 0 | 0 | 0 | 1 | 0 | 0 | 46 | 1 | 1 | 0 | 0 | 0 | 0 | 1 | 1 |
| 47 | 1 | 1 | 0 | 0 | 0 | 0 | 0 | 1 | 47 | 1 | 1 | 1 | 0 | 1 | 1 | 1 | 1 |
| 48 | 1 | 1 | 1 | 0 | 1 | 0 | 1 | 1 | 48 | 1 | 1 | 1 | 1 | 1 | 0 | 0 | 1 |
| 49 | 0 | 1 | 0 | 1 | 0 | 0 | 0 | 1 | 49 | 1 | 1 | 1 | 1 | 0 | 0 | 1 | 0 |
| 50 | 0 | 1 | 0 | 0 | 0 | 1 | 0 | 0 | 50 | 0 | 1 | 1 | 1 | 1 | 0 | 0 | 1 |
| 51 | 1 | 0 | 0 | 0 | 1 | 0 | 0 | 1 | 51 | 1 | 0 | 1 | 0 | 1 | 0 | 1 | 0 |
| 52 | 1 | 0 | 0 | 1 | 1 | 1 | 0 | 0 | 52 | 0 | 1 | 0 | 1 | 1 | 0 | 0 | 1 |
| 53 | 1 | 1 | 0 | 1 | 1 | 1 | 1 | 1 | 53 | 1 | 0 | 1 | 0 | 0 | 0 | 1 | 0 |
| 54 | 0 | 0 | 0 | 0 | 1 | 1 | 0 | 1 | 54 | 0 | 1 | 0 | 1 | 0 | 0 | 0 | 1 |
| 55 | 0 | 1 | 0 | 0 | 1 | 1 | 0 | 1 | 55 | 1 | 0 | 1 | 0 | 0 | 1 | 1 | 0 |
| 56 | 0 | 0 | 1 | 1 | 1 | 1 | 0 | 1 | 56 | 0 | 1 | 0 | 1 | 0 | 0 | 1 | 1 |
| 57 | 0 | 1 | 1 | 0 | 1 | 1 | 0 | 0 | 57 | 1 | 0 | 1 | 0 | 0 | 1 | 1 | 1 |
| 58 | 1 | 1 | 1 | 1 | 1 | 1 | 0 | 1 | 58 | 1 | 1 | 0 | 1 | 1 | 1 | 0 | 1 |
| 59 | 1 | 0 | 0 | 0 | 1 | 1 | 1 | 0 | 59 | 1 | 1 | 1 | 0 | 0 | 0 | 0 | 0 |
| 60 | 1 | 0 | 1 | 1 | 1 | 0 | 0 | 1 | 60 | 0 | 1 | 1 | 1 | 0 | 0 | 0 | 0 |
| 61 | 0 | 0 | 1 | 0 | 0 | 0 | 1 | 0 | 61 | 0 | 0 | 1 | 1 | 1 | 0 | 0 | 0 |
| 62 | 1 | 0 | 0 | 1 | 0 | 1 | 0 | 0 | 62 | 0 | 0 | 0 | 1 | 1 | 1 | 0 | 0 |
| 63 | 0 | 1 | 1 | 0 | 0 | 0 | 0 | 0 | 63 | 0 | 0 | 0 | 0 | 1 | 1 | 1 | 1 |
| 64 | 0 | 0 | 0 | 0 | 0 | 0 | 0 | 1 | 64 | 0 | 0 | 0 | 0 | 0 | 1 | 1 | 1 |
| 65 | 0 | 1 | 0 | 0 | 0 | 1 | 1 | 1 | 65 | 1 | 0 | 0 | 0 | 1 | 1 | 0 | 1 |
| 66 | 0 | 1 | 1 | 1 | 1 | 0 | 1 | 1 | 66 | 1 | 1 | 0 | 0 | 1 | 0 | 0 | 0 |
| 67 | 1 | 0 | 1 | 0 | 0 | 1 | 0 | 0 | 67 | 0 | 1 | 1 | 0 | 0 | 1 | 0 | 0 |
| 68 | 1 | 0 | 1 | 0 | 0 | 0 | 0 | 0 | 68 | 0 | 0 | 1 | 1 | 0 | 0 | 1 | 0 |
| 69 | 0 | 0 | 1 | 0 | 1 | 0 | 0 | 1 | 69 | 0 | 0 | 0 | 1 | 1 | 0 | 0 | 1 |
| 70 | 1 | 1 | 0 | 1 | 0 | 1 | 1 | 0 | 70 | 1 | 0 | 0 | 0 | 0 | 0 | 1 | 0 |
| 71 | 0 | 0 | 0 | 0 | 1 | 0 | 0 | 1 | 71 | 1 | 0 | 0 | 0 | 0 | 0 | 1 |   |
| 72 | 0 | 0 | 1 | 0 | 0 | 1 | 0 | 0 | 72 | 1 | 0 | 1 | 0 | 1 | 1 | 1 | 0 |
| 73 | 0 | 1 | 1 | 0 | 1 | 1 | 1 | 0 | 73 | 0 | 1 | 0 | 1 | 0 | 1 | 1 | 1 |
| 74 | 1 | 1 | 1 | 0 | 0 | 0 | 0 | 1 | 74 | 1 | 0 | 1 | 0 | 0 | 1 | 0 | 1 |
| 75 | 0 | 1 | 0 | 1 | 0 | 0 | 1 | 1 | 75 | 1 | 1 | 0 | 1 | 1 | 1 | 0 | 0 |
| 76 | 1 | 1 | 1 | 0 | 1 | 1 | 1 | 0 | 76 | 0 | 1 | 0 | 1 | 1 | 1 | 0 | 0 |
| 77 | 0 | 1 | 1 | 1 | 0 | 1 | 0 | 1 | 77 | 0 | 0 | 1 | 1 | 0 | 1 | 1 | 1 |
| 78 | 1 | 1 | 1 | 0 | 0 | 1 | 0 | 0 | 78 | 1 | 0 | 0 | 1 | 0 | 1 | 0 | 1 |
| 79 | 0 | 1 | 1 | 1 | 1 | 1 | 1 | 0 | 79 | 1 | 1 | 0 | 0 | 0 | 1 | 0 | 0 |
| 80 | 1 | 1 | 0 | 1 | 0 | 0 | 0 | 0 | 80 | 0 | 1 | 1 | 0 | 0 | 0 | 1 | 0 |
| 81 | 0 | 0 | 1 | 1 | 0 | 1 | 1 | 0 | 81 | 0 | 0 | 1 | 1 | 0 | 0 | 0 | 1 |
| 82 | 0 | 1 | 1 | 0 | 0 | 1 | 0 | 0 | 82 | 1 | 0 | 0 | 1 | 0 | 1 | 1 | 0 |
| 83 | 0 | 0 | 1 | 1 | 1 | 0 | 0 | 0 | 83 | 0 | 1 | 0 | 0 | 1 | 0 | 1 | 1 |
| 84 | 0 | 1 | 1 | 0 | 1 | 1 | 1 | 1 | 84 | 1 | 0 | 1 | 0 | 1 | 0 | 1 | 1 |
| 85 | 0 | 1 | 1 | 0 | 0 | 0 | 0 | 0 | 85 | 1 | 1 | 0 | 1 | 1 | 0 | 1 | 1 |
| 86 | 0 | 0 | 1 | 0 | 1 | 0 | 1 | 1 | 86 | 1 | 1 | 1 | 0 | 0 | 1 | 1 | 1 |
| 87 | 0 | 1 | 0 | 0 | 1 | 0 | 0 | 1 | 87 | 1 | 1 | 1 | 1 | 1 | 1 | 1 | 1 |
| 88 | 0 | 0 | 0 | 1 | 0 | 1 | 0 | 1 | 88 | 1 | 1 | 1 | 1 | 0 | 0 | 0 | 1 |
| 89 | 0 | 0 | 1 | 1 | 0 | 1 | 0 | 0 | 89 | 1 | 1 | 1 | 1 | 0 | 1 | 1 | 0 |
| 90 | 1 | 1 | 1 | 1 | 0 | 0 | 0 | 1 | 90 | 0 | 1 | 1 | 1 | 1 | 0 | 1 | 1 |
| 91 | 1 | 0 | 1 | 0 | 1 | 0 | 1 | 0 | 91 | 1 | 0 | 1 | 0 | 0 | 1 | 1 | 1 |
| 92 | 1 | 0 | 0 | 0 | 0 | 0 | 1 | 1 | 92 | 1 | 1 | 0 | 1 | 0 | 1 | 1 | 1 |
| 93 | 1 | 1 | 0 | 0 | 1 | 1 | 1 | 0 | 93 | 1 | 1 | 1 | 0 | 0 | 1 | 0 | 1 |
| 94 | 1 | 1 | 0 | 0 | 0 | 0 | 0 | 0 | 94 | 1 | 1 | 1 | 1 | 1 | 1 | 0 | 0 |
| 95 | 1 | 1 | 0 | 0 | 0 | 1 | 1 | 0 | 95 | 0 | 1 | 1 | 1 | 1 | 1 | 1 | 0 |

-continued

| LOG TABLE | | | | | | | | | ANTI-LOG TABLE | | | | | | | | |
|---|---|---|---|---|---|---|---|---|---|---|---|---|---|---|---|---|---|
| ADDRESS | | | ENTRY | | | | | | ADDRESS | | | ENTRY | | | | | |
| 96  | 1 | 1 | 1 | 0 | 1 | 0 | 0 | 0 | 96  | 0 | 0 | 1 | 1 | 1 | 1 | 1 | 1 |
| 97  | 1 | 1 | 0 | 0 | 0 | 1 | 0 | 0 | 97  | 1 | 0 | 0 | 1 | 0 | 0 | 0 | 1 |
| 98  | 0 | 1 | 0 | 1 | 0 | 0 | 0 | 0 | 98  | 1 | 1 | 0 | 0 | 0 | 1 | 1 | 0 |
| 99  | 0 | 1 | 1 | 0 | 0 | 0 | 1 | 1 | 99  | 0 | 1 | 1 | 0 | 0 | 0 | 1 | 1 |
| 100 | 0 | 1 | 0 | 0 | 0 | 0 | 1 | 1 | 100 | 1 | 0 | 1 | 1 | 1 | 1 | 1 | 1 |
| 101 | 1 | 0 | 1 | 1 | 1 | 1 | 1 | 0 | 101 | 1 | 1 | 0 | 1 | 0 | 0 | 0 | 1 |
| 102 | 1 | 0 | 0 | 0 | 1 | 0 | 0 | 0 | 102 | 1 | 1 | 1 | 0 | 0 | 1 | 1 | 0 |
| 103 | 1 | 0 | 0 | 1 | 1 | 0 | 0 | 0 | 103 | 0 | 1 | 1 | 1 | 0 | 0 | 1 | 1 |
| 104 | 1 | 0 | 0 | 1 | 1 | 0 | 1 | 1 | 104 | 1 | 0 | 1 | 1 | 0 | 1 | 1 | 1 |
| 105 | 1 | 1 | 0 | 0 | 1 | 1 | 0 | 0 | 105 | 1 | 1 | 0 | 1 | 0 | 1 | 0 | 1 |
| 106 | 1 | 1 | 0 | 1 | 1 | 1 | 1 | 0 | 106 | 1 | 1 | 1 | 0 | 0 | 1 | 0 | 0 |
| 107 | 1 | 0 | 1 | 1 | 0 | 0 | 1 | 0 | 107 | 0 | 1 | 1 | 1 | 0 | 0 | 1 | 0 |
| 108 | 0 | 0 | 0 | 0 | 1 | 1 | 0 | 0 | 108 | 0 | 0 | 1 | 1 | 1 | 0 | 0 | 1 |
| 109 | 1 | 0 | 0 | 0 | 0 | 0 | 0 | 1 | 109 | 1 | 0 | 0 | 1 | 0 | 0 | 1 | 0 |
| 110 | 0 | 1 | 0 | 0 | 1 | 1 | 0 | 0 | 110 | 0 | 1 | 0 | 0 | 1 | 0 | 0 | 1 |
| 111 | 1 | 1 | 0 | 0 | 1 | 0 | 0 | 1 | 111 | 1 | 0 | 1 | 0 | 1 | 0 | 1 | 0 |
| 112 | 0 | 0 | 1 | 1 | 1 | 1 | 0 | 0 | 112 | 0 | 1 | 0 | 1 | 0 | 1 | 0 | 1 |
| 113 | 1 | 0 | 1 | 0 | 1 | 0 | 0 | 0 | 113 | 1 | 0 | 1 | 0 | 0 | 1 | 0 | 0 |
| 114 | 0 | 1 | 1 | 0 | 1 | 0 | 1 | 1 | 114 | 0 | 1 | 0 | 1 | 0 | 0 | 1 | 0 |
| 115 | 0 | 1 | 1 | 0 | 0 | 1 | 1 | 1 | 115 | 0 | 0 | 1 | 0 | 1 | 0 | 0 | 1 |
| 116 | 1 | 1 | 1 | 1 | 1 | 1 | 0 | 0 | 116 | 1 | 0 | 0 | 1 | 1 | 0 | 1 | 0 |
| 117 | 1 | 1 | 1 | 1 | 0 | 0 | 0 | 1 | 117 | 0 | 1 | 0 | 0 | 1 | 1 | 0 | 1 |
| 118 | 1 | 0 | 0 | 0 | 1 | 1 | 0 | 1 | 118 | 1 | 0 | 1 | 0 | 1 | 0 | 0 | 0 |
| 119 | 1 | 1 | 0 | 1 | 1 | 0 | 1 | 1 | 119 | 0 | 1 | 0 | 1 | 0 | 1 | 0 | 0 |
| 120 | 1 | 0 | 1 | 1 | 1 | 0 | 0 | 0 | 120 | 0 | 0 | 1 | 0 | 1 | 0 | 1 | 0 |
| 121 | 0 | 0 | 1 | 1 | 0 | 0 | 1 | 0 | 121 | 0 | 0 | 0 | 1 | 0 | 1 | 0 | 1 |
| 122 | 0 | 0 | 1 | 0 | 0 | 0 | 0 | 1 | 122 | 1 | 0 | 0 | 0 | 1 | 0 | 0 | 0 |
| 123 | 0 | 1 | 0 | 1 | 1 | 0 | 1 | 0 | 123 | 0 | 1 | 0 | 0 | 0 | 0 | 1 | 0 |
| 124 | 1 | 0 | 0 | 1 | 0 | 0 | 1 | 1 | 124 | 0 | 0 | 1 | 0 | 0 | 0 | 0 | 1 |
| 125 | 0 | 0 | 0 | 1 | 0 | 0 | 1 | 1 | 125 | 1 | 0 | 0 | 1 | 1 | 1 | 1 | 0 |
| 126 | 0 | 1 | 0 | 1 | 1 | 1 | 1 | 1 | 126 | 0 | 1 | 0 | 0 | 1 | 1 | 1 | 1 |
| 127 | 1 | 0 | 1 | 0 | 1 | 1 | 1 | 1 | 127 | 1 | 0 | 1 | 0 | 1 | 0 | 0 | 1 |
| 128 | 0 | 0 | 0 | 0 | 0 | 0 | 0 | 0 | 128 | 1 | 1 | 0 | 1 | 1 | 0 | 1 | 0 |
| 129 | 1 | 0 | 0 | 1 | 0 | 1 | 1 | 0 | 129 | 0 | 1 | 1 | 0 | 1 | 1 | 0 | 1 |
| 130 | 0 | 1 | 0 | 0 | 0 | 1 | 1 | 0 | 130 | 1 | 0 | 1 | 1 | 1 | 0 | 0 | 0 |
| 131 | 0 | 0 | 0 | 0 | 1 | 1 | 1 | 1 | 131 | 0 | 1 | 0 | 1 | 1 | 1 | 0 | 0 |
| 132 | 0 | 1 | 1 | 1 | 1 | 0 | 1 | 0 | 132 | 0 | 0 | 1 | 0 | 1 | 1 | 1 | 0 |
| 133 | 1 | 0 | 0 | 0 | 0 | 1 | 1 | 0 | 133 | 0 | 0 | 0 | 1 | 0 | 1 | 1 | 1 |
| 134 | 1 | 0 | 1 | 0 | 0 | 0 | 1 | 1 | 134 | 1 | 0 | 0 | 0 | 0 | 1 | 0 | 1 |
| 135 | 1 | 1 | 1 | 1 | 1 | 0 | 0 | 1 | 135 | 1 | 1 | 0 | 0 | 1 | 1 | 0 | 0 |
| 136 | 1 | 0 | 0 | 1 | 1 | 1 | 1 | 1 | 136 | 0 | 1 | 1 | 0 | 0 | 1 | 1 | 0 |
| 137 | 1 | 0 | 1 | 1 | 1 | 1 | 0 | 0 | 137 | 0 | 0 | 1 | 1 | 0 | 0 | 1 | 1 |
| 138 | 0 | 0 | 1 | 0 | 1 | 0 | 0 | 0 | 138 | 1 | 0 | 0 | 1 | 0 | 1 | 1 | 1 |
| 139 | 0 | 0 | 0 | 1 | 1 | 0 | 0 | 1 | 139 | 1 | 1 | 0 | 0 | 0 | 1 | 0 | 1 |
| 140 | 1 | 1 | 0 | 1 | 0 | 1 | 0 | 1 | 140 | 1 | 1 | 1 | 0 | 1 | 1 | 0 | 0 |
| 141 | 0 | 1 | 0 | 0 | 0 | 0 | 0 | 1 | 141 | 0 | 1 | 1 | 1 | 0 | 1 | 1 | 0 |
| 142 | 0 | 0 | 0 | 0 | 1 | 0 | 0 | 0 | 142 | 0 | 0 | 1 | 1 | 1 | 0 | 1 | 1 |
| 143 | 1 | 1 | 1 | 0 | 1 | 1 | 1 | 0 | 143 | 1 | 0 | 0 | 1 | 0 | 0 | 1 | 1 |
| 144 | 0 | 0 | 1 | 0 | 0 | 0 | 1 | 1 | 144 | 1 | 1 | 0 | 0 | 0 | 1 | 1 | 1 |
| 145 | 0 | 1 | 1 | 0 | 0 | 0 | 0 | 1 | 145 | 1 | 1 | 1 | 0 | 1 | 1 | 0 | 1 |
| 146 | 0 | 1 | 1 | 0 | 1 | 1 | 0 | 1 | 146 | 1 | 1 | 1 | 1 | 1 | 0 | 0 | 0 |
| 147 | 1 | 0 | 0 | 0 | 1 | 1 | 1 | 1 | 147 | 0 | 1 | 1 | 1 | 1 | 1 | 0 | 0 |
| 148 | 1 | 1 | 1 | 0 | 0 | 0 | 0 | 0 | 148 | 0 | 0 | 1 | 1 | 1 | 1 | 1 | 0 |
| 149 | 0 | 1 | 0 | 0 | 1 | 1 | 1 | 0 | 149 | 0 | 0 | 0 | 1 | 1 | 1 | 1 | 1 |
| 150 | 0 | 1 | 0 | 1 | 0 | 0 | 1 | 0 | 150 | 1 | 0 | 0 | 0 | 0 | 0 | 0 | 1 |
| 151 | 1 | 0 | 0 | 0 | 1 | 0 | 1 | 0 | 151 | 1 | 1 | 0 | 1 | 1 | 1 | 1 | 0 |
| 152 | 1 | 1 | 1 | 1 | 0 | 1 | 0 | 1 | 152 | 0 | 1 | 1 | 0 | 0 | 1 | 1 | 1 |
| 153 | 1 | 1 | 0 | 0 | 0 | 0 | 1 | 0 | 153 | 1 | 0 | 1 | 1 | 1 | 1 | 0 | 1 |
| 154 | 0 | 1 | 1 | 1 | 0 | 1 | 0 | 0 | 154 | 1 | 1 | 0 | 1 | 0 | 0 | 0 | 0 |
| 155 | 0 | 0 | 1 | 0 | 1 | 1 | 0 | 1 | 155 | 0 | 1 | 1 | 0 | 1 | 0 | 0 | 0 |
| 156 | 1 | 1 | 1 | 0 | 0 | 0 | 1 | 1 | 156 | 0 | 0 | 1 | 1 | 0 | 1 | 0 | 0 |
| 157 | 1 | 1 | 1 | 0 | 0 | 1 | 1 | 0 | 157 | 0 | 0 | 0 | 1 | 1 | 0 | 1 | 0 |
| 158 | 0 | 1 | 1 | 1 | 1 | 1 | 0 | 1 | 158 | 0 | 0 | 0 | 0 | 1 | 1 | 0 | 1 |
| 159 | 1 | 1 | 0 | 1 | 1 | 0 | 0 | 0 | 159 | 1 | 0 | 0 | 0 | 1 | 0 | 0 | 0 |
| 160 | 1 | 1 | 0 | 0 | 1 | 1 | 1 | 1 | 160 | 0 | 1 | 0 | 0 | 0 | 1 | 0 | 0 |
| 161 | 1 | 1 | 0 | 0 | 0 | 1 | 1 | 1 | 161 | 0 | 0 | 1 | 0 | 0 | 0 | 1 | 0 |
| 162 | 0 | 0 | 1 | 1 | 0 | 1 | 0 | 1 | 162 | 0 | 0 | 0 | 1 | 0 | 0 | 0 | 1 |
| 163 | 1 | 0 | 1 | 0 | 1 | 0 | 1 | 1 | 163 | 1 | 0 | 0 | 0 | 0 | 1 | 1 | 0 |
| 164 | 0 | 1 | 1 | 1 | 0 | 0 | 0 | 1 | 164 | 0 | 1 | 0 | 0 | 0 | 1 | 1 | 1 |
| 165 | 0 | 1 | 0 | 0 | 1 | 0 | 1 | 0 | 165 | 1 | 0 | 1 | 0 | 1 | 1 | 1 | 1 |
| 166 | 0 | 0 | 1 | 1 | 0 | 1 | 1 | 1 | 166 | 1 | 1 | 0 | 1 | 1 | 0 | 0 | 1 |
| 167 | 0 | 0 | 1 | 1 | 1 | 0 | 0 | 1 | 167 | 1 | 1 | 1 | 0 | 0 | 0 | 1 | 0 |
| 168 | 0 | 1 | 1 | 1 | 0 | 1 | 1 | 0 | 168 | 0 | 1 | 1 | 1 | 0 | 0 | 0 | 1 |
| 169 | 0 | 1 | 1 | 1 | 1 | 1 | 1 | 0 | 169 | 1 | 0 | 1 | 1 | 0 | 1 | 1 | 0 |
| 170 | 0 | 1 | 1 | 0 | 1 | 1 | 1 | 1 | 170 | 0 | 1 | 0 | 1 | 1 | 0 | 1 | 1 |
| 171 | 0 | 1 | 0 | 1 | 0 | 1 | 0 | 0 | 171 | 1 | 0 | 1 | 0 | 0 | 0 | 1 | 1 |
| 172 | 0 | 0 | 1 | 0 | 1 | 0 | 1 | 0 | 172 | 1 | 1 | 0 | 1 | 1 | 1 | 1 | 1 |
| 173 | 0 | 0 | 0 | 0 | 1 | 0 | 1 | 0 | 173 | 1 | 1 | 1 | 0 | 0 | 0 | 0 | 1 |
| 174 | 0 | 1 | 0 | 0 | 1 | 0 | 0 | 0 | 174 | 1 | 1 | 1 | 1 | 1 | 1 | 1 | 0 |
| 175 | 1 | 0 | 1 | 0 | 0 | 1 | 0 | 1 | 175 | 0 | 1 | 1 | 1 | 1 | 1 | 1 | 1 |
| 176 | 0 | 0 | 0 | 1 | 0 | 1 | 0 | 0 | 176 | 1 | 0 | 1 | 1 | 0 | 0 | 0 | 1 |
| 177 | 1 | 0 | 1 | 1 | 0 | 0 | 0 | 0 | 177 | 1 | 1 | 0 | 1 | 0 | 1 | 1 | 0 |
| 178 | 0 | 0 | 1 | 1 | 0 | 0 | 1 | 1 | 178 | 0 | 1 | 1 | 0 | 1 | 0 | 1 | 1 |
| 179 | 0 | 1 | 0 | 1 | 1 | 0 | 1 | 1 | 179 | 1 | 0 | 1 | 1 | 0 | 1 | 1 | 1 |
| 180 | 1 | 1 | 1 | 1 | 0 | 0 | 1 | 0 | 180 | 1 | 1 | 0 | 1 | 0 | 0 | 1 | 1 |
| 181 | 1 | 1 | 0 | 1 | 1 | 1 | 0 | 0 | 181 | 1 | 1 | 1 | 0 | 0 | 1 | 1 | 1 |
| 182 | 1 | 0 | 1 | 0 | 1 | 0 | 0 | 1 | 182 | 1 | 1 | 1 | 1 | 1 | 1 | 0 | 1 |
| 183 | 0 | 1 | 1 | 0 | 1 | 0 | 0 | 0 | 183 | 1 | 1 | 1 | 1 | 0 | 0 | 0 | 0 |
| 184 | 1 | 0 | 0 | 0 | 0 | 0 | 1 | 0 | 184 | 0 | 1 | 1 | 1 | 1 | 0 | 0 | 0 |
| 185 | 1 | 1 | 0 | 0 | 1 | 0 | 1 | 0 | 185 | 0 | 0 | 1 | 1 | 1 | 1 | 0 | 0 |
| 186 | 1 | 1 | 0 | 0 | 1 | 1 | 0 | 1 | 186 | 0 | 0 | 0 | 1 | 1 | 1 | 1 | 0 |

-continued

| | LOG TABLE | | | | | | | | | ANTI-LOG TABLE | | | | | | | | |
|---|---|---|---|---|---|---|---|---|---|---|---|---|---|---|---|---|---|---|
| ADDRESS | ENTRY | | | | | | | | ADDRESS | ENTRY | | | | | | | | |
| 187 | 1 | 0 | 1 | 1 | 0 | 0 | 1 | 1 | 187 | 0 | 0 | 0 | 0 | 1 | 1 | 1 | 1 |
| 188 | 1 | 0 | 1 | 1 | 1 | 1 | 1 | 1 | 188 | 1 | 0 | 0 | 0 | 1 | 0 | 0 | 1 |
| 189 | 1 | 0 | 0 | 1 | 1 | 0 | 0 | 1 | 189 | 1 | 1 | 0 | 0 | 1 | 0 | 1 | 0 |
| 190 | 1 | 1 | 0 | 0 | 0 | 1 | 0 | 1 | 190 | 0 | 1 | 1 | 0 | 0 | 1 | 0 | 1 |
| 191 | 0 | 1 | 1 | 0 | 0 | 1 | 0 | 0 | 191 | 1 | 0 | 1 | 1 | 1 | 1 | 0 | 0 |
| 192 | 1 | 1 | 1 | 0 | 0 | 1 | 1 | 1 | 192 | 0 | 1 | 0 | 1 | 1 | 1 | 1 | 0 |
| 193 | 1 | 1 | 0 | 1 | 1 | 0 | 0 | 1 | 193 | 0 | 0 | 1 | 0 | 1 | 1 | 1 | 1 |
| 194 | 1 | 1 | 0 | 0 | 0 | 0 | 1 | 1 | 194 | 1 | 0 | 0 | 1 | 1 | 0 | 0 | 1 |
| 195 | 0 | 0 | 1 | 0 | 1 | 1 | 1 | 0 | 195 | 1 | 1 | 0 | 0 | 0 | 0 | 1 | 0 |
| 196 | 0 | 1 | 0 | 0 | 1 | 1 | 1 | 1 | 196 | 0 | 1 | 1 | 0 | 0 | 0 | 0 | 1 |
| 197 | 1 | 0 | 0 | 0 | 1 | 0 | 1 | 1 | 197 | 1 | 0 | 1 | 1 | 1 | 1 | 1 | 0 |
| 198 | 0 | 1 | 1 | 0 | 0 | 0 | 1 | 0 | 198 | 0 | 1 | 0 | 1 | 1 | 1 | 1 | 1 |
| 199 | 1 | 0 | 0 | 1 | 0 | 0 | 0 | 0 | 199 | 1 | 0 | 1 | 0 | 0 | 0 | 0 | 1 |
| 200 | 0 | 1 | 0 | 0 | 0 | 0 | 1 | 0 | 200 | 1 | 1 | 0 | 1 | 1 | 1 | 1 | 0 |
| 201 | 1 | 1 | 1 | 0 | 1 | 1 | 1 | 1 | 201 | 0 | 1 | 1 | 0 | 1 | 1 | 1 | 1 |
| 202 | 1 | 0 | 1 | 1 | 1 | 1 | 0 | 1 | 202 | 1 | 0 | 1 | 1 | 1 | 0 | 0 | 1 |
| 203 | 0 | 0 | 0 | 1 | 1 | 0 | 1 | 0 | 203 | 1 | 1 | 0 | 1 | 0 | 0 | 1 | 0 |
| 204 | 1 | 0 | 0 | 0 | 0 | 1 | 1 | 1 | 204 | 0 | 1 | 1 | 0 | 1 | 0 | 0 | 1 |
| 205 | 1 | 1 | 1 | 1 | 1 | 0 | 1 | 0 | 205 | 1 | 0 | 1 | 1 | 1 | 0 | 1 | 0 |
| 206 | 1 | 0 | 0 | 1 | 0 | 1 | 1 | 1 | 206 | 0 | 1 | 0 | 1 | 1 | 1 | 0 | 1 |
| 207 | 0 | 0 | 0 | 1 | 0 | 0 | 0 | 0 | 207 | 1 | 0 | 1 | 0 | 0 | 0 | 0 | 0 |
| 208 | 1 | 0 | 0 | 1 | 1 | 0 | 1 | 0 | 208 | 0 | 1 | 0 | 1 | 0 | 0 | 0 | 0 |
| 209 | 0 | 1 | 1 | 0 | 0 | 1 | 0 | 1 | 209 | 0 | 0 | 1 | 0 | 1 | 0 | 0 | 0 |
| 210 | 1 | 1 | 0 | 0 | 1 | 0 | 1 | 1 | 210 | 0 | 0 | 0 | 1 | 0 | 1 | 0 | 0 |
| 211 | 1 | 0 | 1 | 1 | 0 | 1 | 0 | 0 | 211 | 0 | 0 | 0 | 0 | 1 | 0 | 1 | 0 |
| 212 | 1 | 1 | 0 | 1 | 1 | 1 | 0 | 1 | 212 | 0 | 0 | 0 | 0 | 0 | 1 | 0 | 1 |
| 213 | 0 | 1 | 1 | 1 | 0 | 1 | 0 | 0 | 213 | 1 | 0 | 0 | 0 | 1 | 1 | 0 | 0 |
| 214 | 1 | 0 | 1 | 1 | 0 | 0 | 0 | 1 | 214 | 0 | 1 | 0 | 0 | 0 | 1 | 1 | 0 |
| 215 | 0 | 1 | 0 | 1 | 1 | 1 | 0 | 0 | 215 | 0 | 0 | 1 | 0 | 0 | 0 | 1 | 1 |
| 216 | 0 | 0 | 0 | 0 | 1 | 0 | 1 | 1 | 216 | 1 | 0 | 0 | 1 | 1 | 1 | 1 | 1 |
| 217 | 1 | 0 | 1 | 0 | 0 | 1 | 1 | 0 | 217 | 1 | 1 | 0 | 0 | 0 | 0 | 0 | 1 |
| 218 | 1 | 0 | 0 | 0 | 0 | 0 | 0 | 0 | 218 | 1 | 1 | 1 | 0 | 1 | 1 | 1 | 0 |
| 219 | 0 | 1 | 0 | 1 | 0 | 1 | 0 | 1 | 219 | 0 | 1 | 1 | 1 | 0 | 1 | 1 | 1 |
| 220 | 0 | 1 | 0 | 0 | 1 | 0 | 1 | 1 | 220 | 1 | 0 | 1 | 1 | 0 | 1 | 0 | 1 |
| 221 | 0 | 0 | 1 | 1 | 1 | 0 | 1 | 0 | 221 | 1 | 1 | 0 | 1 | 0 | 1 | 0 | 0 |
| 222 | 1 | 1 | 0 | 0 | 1 | 0 | 0 | 0 | 222 | 0 | 1 | 1 | 0 | 1 | 0 | 1 | 0 |
| 223 | 1 | 0 | 1 | 0 | 1 | 1 | 0 | 0 | 223 | 0 | 0 | 1 | 1 | 0 | 1 | 0 | 1 |
| 224 | 0 | 0 | 1 | 1 | 1 | 0 | 1 | 1 | 224 | 1 | 0 | 0 | 1 | 0 | 1 | 0 | 0 |
| 225 | 1 | 0 | 1 | 0 | 1 | 1 | 0 | 1 | 225 | 0 | 1 | 0 | 0 | 1 | 0 | 1 | 0 |
| 226 | 1 | 0 | 1 | 0 | 0 | 1 | 1 | 1 | 226 | 0 | 0 | 1 | 0 | 0 | 1 | 0 | 1 |
| 227 | 0 | 1 | 0 | 1 | 0 | 1 | 1 | 0 | 227 | 1 | 0 | 0 | 1 | 1 | 1 | 0 | 0 |
| 228 | 0 | 1 | 1 | 0 | 1 | 0 | 1 | 0 | 228 | 0 | 1 | 0 | 0 | 1 | 1 | 1 | 0 |
| 229 | 0 | 1 | 0 | 1 | 1 | 1 | 0 | 1 | 229 | 0 | 0 | 1 | 0 | 0 | 1 | 1 | 1 |
| 230 | 0 | 1 | 1 | 0 | 0 | 1 | 1 | 0 | 230 | 1 | 0 | 0 | 1 | 1 | 1 | 0 | 1 |
| 231 | 1 | 0 | 1 | 1 | 0 | 1 | 0 | 1 | 231 | 1 | 1 | 0 | 0 | 0 | 0 | 0 | 0 |
| 232 | 1 | 1 | 1 | 1 | 1 | 0 | 1 | 1 | 232 | 0 | 1 | 1 | 0 | 0 | 0 | 0 | 0 |
| 233 | 0 | 0 | 0 | 1 | 0 | 0 | 0 | 1 | 233 | 0 | 0 | 1 | 1 | 0 | 0 | 0 | 0 |
| 234 | 1 | 1 | 1 | 1 | 0 | 0 | 0 | 0 | 234 | 0 | 0 | 0 | 1 | 1 | 0 | 0 | 0 |
| 235 | 0 | 0 | 0 | 1 | 1 | 0 | 1 | 1 | 235 | 0 | 0 | 0 | 0 | 1 | 1 | 0 | 0 |
| 236 | 1 | 0 | 0 | 0 | 1 | 1 | 0 | 0 | 236 | 0 | 0 | 0 | 0 | 0 | 1 | 1 | 0 |
| 237 | 1 | 0 | 0 | 1 | 0 | 0 | 0 | 1 | 237 | 0 | 0 | 0 | 0 | 0 | 0 | 1 | 1 |
| 238 | 1 | 1 | 0 | 1 | 1 | 0 | 1 | 0 | 238 | 1 | 0 | 0 | 0 | 1 | 1 | 1 | 1 |
| 239 | 0 | 0 | 1 | 0 | 1 | 1 | 1 | 1 | 239 | 1 | 1 | 0 | 0 | 1 | 0 | 0 | 1 |
| 240 | 1 | 0 | 1 | 1 | 0 | 1 | 1 | 1 | 240 | 1 | 1 | 1 | 0 | 1 | 0 | 1 | 0 |
| 241 | 0 | 1 | 0 | 1 | 1 | 0 | 0 | 0 | 241 | 0 | 1 | 1 | 0 | 1 | 0 | 0 | 1 |
| 242 | 0 | 0 | 1 | 1 | 0 | 0 | 0 | 1 | 242 | 1 | 0 | 1 | 1 | 0 | 1 | 0 | 0 |
| 243 | 0 | 0 | 0 | 1 | 1 | 1 | 0 | 1 | 243 | 0 | 1 | 0 | 1 | 1 | 0 | 1 | 0 |
| 244 | 0 | 0 | 1 | 0 | 0 | 0 | 0 | 0 | 244 | 0 | 0 | 1 | 0 | 1 | 1 | 0 | 1 |
| 245 | 0 | 0 | 0 | 1 | 1 | 1 | 1 | 1 | 245 | 1 | 0 | 0 | 1 | 1 | 0 | 0 | 0 |
| 246 | 0 | 1 | 0 | 1 | 1 | 0 | 0 | 1 | 246 | 0 | 1 | 0 | 0 | 1 | 1 | 0 | 0 |
| 247 | 0 | 0 | 0 | 1 | 1 | 1 | 1 | 0 | 247 | 0 | 0 | 1 | 0 | 0 | 1 | 1 | 0 |
| 248 | 1 | 0 | 0 | 1 | 0 | 0 | 1 | 0 | 248 | 0 | 0 | 0 | 1 | 0 | 0 | 1 | 1 |
| 249 | 0 | 0 | 1 | 1 | 0 | 0 | 0 | 0 | 249 | 1 | 0 | 0 | 0 | 0 | 1 | 1 | 1 |
| 250 | 0 | 0 | 0 | 1 | 0 | 0 | 1 | 0 | 250 | 1 | 1 | 0 | 0 | 1 | 1 | 0 | 1 |
| 251 | 0 | 0 | 0 | 1 | 1 | 1 | 0 | 0 | 251 | 1 | 1 | 1 | 0 | 1 | 0 | 0 | 0 |
| 252 | 0 | 1 | 0 | 1 | 1 | 1 | 1 | 0 | 252 | 0 | 1 | 1 | 1 | 0 | 1 | 0 | 0 |
| 253 | 1 | 0 | 1 | 1 | 0 | 1 | 1 | 0 | 253 | 0 | 0 | 1 | 1 | 1 | 0 | 1 | 0 |
| 254 | 1 | 0 | 1 | 0 | 1 | 1 | 1 | 0 | 254 | 0 | 0 | 0 | 1 | 1 | 1 | 0 | 1 |
| 255 | 0 | 1 | 0 | 1 | 0 | 1 | 1 | 1 | 255 | 1 | 0 | 0 | 0 | 0 | 0 | 0 | 0 |

The algebraic operations required in the described decoding procedure are addition, multiplication, division, and test for zero. The following are examples of how each of the operations can be performed by the apparatus of FIG. 5.

To add $\alpha^i$ with $\alpha^j$, these two field elements are fed to A and B registers 41 and 42. The component-wise Exclusive OR of the contents of A and B registers 40 and 42 in Exclusive OR circuit 44 is the sum of the two field elements. For example, $\alpha^{13} + \alpha^{17} = 00110110 + 11101001 = 11011111$. The output of the Exclusive OR circuit 44 is placed in register 46 and from there fed to the work buffer 34.

To test if $\alpha^i$ is a zero element, $\alpha^i$ is loaded to H register 47. A component-wise logic OR of the contents of H register 47 are performed by OR circuit 48 and the result placed into M register 50. The contents of the M register 50 is zero if and only if $\alpha^i$ is a zero field element.

Suppose we want to multiply $\alpha^i$ by $\alpha^j$. These two field elements are first tested for zero. If either one of the elements is zero, the result of the multiplication is zero. If both elements are nonzero, they are sequentially fed into the memory address register (MAR) 52 of log buffer 38. The outputs i and j from the log buffer are stored in D and E registers 54 and 56. Then 1's complement addition of the contents of the D and E registers is performed to yield $i + j = t \mod (2^m - 1)$. The output of anti-log buffer with t as the input is $\alpha^t$. For example, consider the multiplication of $\alpha^{10}$ and $\alpha^9$. The contents in register D and E are 00001010 and 00001001. The 1's complement addition of these two numbers is 00010011. The output from anti-log buffer is then $\alpha^4 = 01111101$.

The division of $\alpha^i$ by $\alpha^j$ is done essentially in the same way as the multiplication of $\alpha^i$ and $\alpha^j$. The only difference is that subtraction instead of addition of register D by register E is performed. This is done by loading the logorithm of $\alpha^j$ into E and loading the complement of E into register F. Then, 1's complement addition of D and F is performed. For example, to divide $\alpha^{10}$ by $\alpha^9$, register D is loaded with 00001010 and register E is loaded with 00001001. Thus register F is 11110110. The 1's complement addition of D and F is 00000001 and register G is $\alpha = 01000000$.

From the description of the preferred embodiment of the invention one skilled in the art will recognize a variety of applications for the invention and appropriate modifications within the scope of the claims.

What is claimed is:

1. In a decoder for an error detection and correction system using a Reed-Solomon code for detection and correcting a plurality of errors in codewords made up of k data and n-k check symbols each symbol made up of m binary bits of information so that the error location polynomial $\sigma(x) = x^e + \sigma_1 x^{e-1} + \ldots \sigma_e$ where e is the number of errors and the coefficients of $\sigma(x)$ are related to the error syndromes $S_i$ generated by the decoder by the equation $S_{i+e} + \sigma_1 S_{1+e-1} + \ldots + \sigma_{e-1} + \sigma_e S_i = 0$ where the syndromes are field elements $\alpha^i$ of $GF(2^m)$ an improved error correction and polynomial calculator for determining the number of errors in the codewords after the decoder determines that at least one error exists comprising, means for determining if $S_0 \neq 0$,
means for setting $\sigma = S_1/S_0$ when $S_0 \neq 0$,
means for determining if $S_2 + \sigma S_1 = 0$ and $S_3 + \sigma S_2 = 0$ when $\sigma = S_1/S_0$ and,
means for providing an indication that one symbol error has occurred when $S_2 + \sigma S_1 = 0$ and $S_3 + \sigma S_2 = 0$ with $\sigma = S_1/S_0$.

2. The decoder for the error detection and correction system of claim 1 including,
means for determining if $S_3 + \sigma S_2 \neq 0$ where $S_2 + \sigma S_1 = 0$ with $\sigma = S_1/S_0$ and if so providing an indication that three symbols are in error or means for determining if $S_0 = 0$ and $S_1 \neq 0$ or if $S_2 + \sigma S_1 \neq 0$ and if $D = 0$ when $\sigma_1 = (S_1 S_2 + S_0 S_3)/\Delta$ and $\sigma_2 = (S_1 S_3 + S_2^2)/\Delta$ where $\Delta = S_1^2 + S_0 S_2$ and $D = S_4 + \sigma_1 S_3 + \sigma_2 S_2$ and if so providing an indication that two symbols are in error.

3. The decoder for the error detection and correction system of claim 1 including;
means for determining if $D \neq 0$ when $S_0 = 0$ and $S_1 \neq 0$ or when $S_2 + \sigma S_1 \neq 0$ where $\sigma_1 = (S_1 S_2 + S_0 S_3)/\Delta$ and $\sigma_2 = (S_1 S_3 + S_2^2)/\Delta$ and $\Delta = S_1^2 + S_0 S_2$ and $D = S_4 + \sigma_1 S_3 + \sigma_2 S_2$ and if so providing an indication that three symbol errors have occurred.

4. The decoder for the error detection and correction system of claim 2 including;
means for determining if $D = 0$ when $S_0 = 0$ and $S_1 = 0$ or when $S_0 \neq 0$ and $S_2 = \sigma S_1 \neq 0$ where $\sigma_1 = (S_1 S_2 + S_0 S_3)/\Delta$ and $\sigma_2 = (S_1 S_3 + S_2^2)/\Delta$ and $\Delta = S_1^2 + S_0 S_2$ and $D = S_4 + \sigma_1 S_3 + \sigma_2 S_2$.

5. The decoder for the error detection and correction system of claim 1 including,
means for determining if $S_2 \neq 0$ when $S_1 = S_0 = 0$ and if so providing an indication that three symbols are in error.

6. The decoder for the error detection and correction system of claim 1 including,
means for determining if $S_3 \neq 0$ or $S_4 \neq 0$, or $S_5 \neq 0$ when $S_0 = S_1 = S_2 = 0$ and if so providing an indication that more than three symbol errors have occurred.

7. The decoder for the error detection and correction system of claim 1 where m = 8 and n − k = 6.

8. The decoder for the error correction and detection system of claim 1 wherein said means recited in claim 1 in total includes a buffer for storing said syndromes,
addition means, multiplication and division means and test for zero means for operating on said syndromes;
sequencer means for controlling the order and steps of said operation; and
a log buffer means for storing partial results from said operations.

9. The decoder for the error correction and detection system of claim 8 wherein said multiplication and division means includes a read-only memory buffer that stores tables for the logarithm and anti-logarithms of field elements $\alpha^i$ of $GF(2^m)$ for performing 1's complement addition.

* * * * *